United States Patent [19]

McCormick et al.

[11] Patent Number: 5,314,727
[45] Date of Patent: May 24, 1994

[54] CHEMICAL VAPOR DEPOSITION OF IRON, RUTHENIUM, AND OSMIUM

[75] Inventors: Fred B. McCormick, Maplewood; Wayne L. Gladfelter, St. Paul; Yoshihide Senzaki, Minneapolis, all of Minn.

[73] Assignee: Minnesota Mining & Mfg. Co./Regents of the University of Minnesota, Minneapolis, Minn.

[21] Appl. No.: 920,771

[22] Filed: Jul. 28, 1992

[51] Int. Cl.$^5$ .............................................. B05D 3/06
[52] U.S. Cl. ................................. 427/584; 427/252; 427/255.3; 427/294; 427/585; 427/586
[58] Field of Search ............... 427/252, 294, 585, 586, 427/255.3, 584

[56] References Cited

U.S. PATENT DOCUMENTS

| | | | |
|---|---|---|---|
| 3,352,707 | 11/1967 | Pickard | 427/255 |
| 3,914,515 | 10/1975 | Kane et al. | 428/432 |
| 3,978,272 | 8/1976 | Donley | 427/160 |
| 4,250,210 | 2/1981 | Crosby et al. | 427/252 |
| 4,340,617 | 7/1982 | Deutsch et al. | 427/53.1 |
| 4,666,742 | 5/1987 | Takakura et al. | 427/229 |
| 4,713,258 | 12/1987 | Umemura | 427/35 |
| 4,721,631 | 1/1988 | Endo et al. | 427/66 |
| 4,868,005 | 9/1989 | Ehrlich et al. | 427/531 |
| 4,876,112 | 10/1989 | Kaito et al. | 427/38 |
| 4,923,717 | 5/1990 | Gladfelter et al. | 427/252 |
| 4,927,670 | 5/1990 | Erbil | 427/265.3 |
| 4,992,305 | 2/1991 | Erbil | 427/252 |
| 5,005,519 | 4/1991 | Egermeier et al. | 118/722 |
| 5,022,905 | 6/1991 | Grundy et al. | 65/60.51 |

OTHER PUBLICATIONS

C. E. Morosanu, in "Thin Films by Chemical Vapor Deposition," Elsevier, N.Y. (1990) at pp. 42–54, 460–475 (no month).
W. Kern et al., in "Thin Film Processes," J. L. Vossen et al., eds., Academic Press, N.Y. (1978) (no month).
D. E. Trent et al., *Inorg. Chem.*, 3, 1057 (1964) (no month).
S. Lehwald et al., *Thin Solid Films*, 21, 523 (1974) (no month).
J. C. Vigui et al., *J. Electrochem. Soc.*, 122, 585 (1975) (no month).
M. L. Green et al., *J. Electrochem. Soc.*, 132, 2677 (1985) (no month).
R. G. Vadimsky et al., *J. Electrochem. Soc.* 126, 2017 (1979) (no month).
D. R. Rolison et al., *J. Electrochem. Soc.*, 126, 407 (1979) (no month).
S. S. P. Parkin et al., *Phys. Rev. Letters*, 64, 204 (1990) (no month).
J. A. Long et al., *J. Crystal Growth*, 71, 42 (1986) (no month).
J. P. Collman et al., in "Principles and Applications of Organotransition Metal Chemistry," University Science Books, Mill Valley, Calif. (1980) at pp. 51–175 (Table of Contents only) (no month).
R. G. Ball et al., *Organometallics*, 6, 1918 (1987) (no month).
M. R. Gagn et al., *Organometallics*, 7, 561 (1988) (no month).

(List continued on next page.)

*Primary Examiner*—Janyce Bell
*Attorney, Agent, or Firm*—Warren D. Woessner

[57] ABSTRACT

A method is provided for forming films comprising Fe, Ru or Os employing the techniques of chemical vapor deposition to decompose a vapor comprising an organometallic compound of the formula (a): $(CO)_4ML$ or (b): $M_2[\mu\text{-}\eta:\eta^4\text{-}C_4](CO)_6$; wherein L is a two-electron donor ligand and each R is H, halo, OH, alkyl, perfluoroalkyl or aryl; so as to deposit a coating comprising one or more of said metals on the surface of a substrate.

17 Claims, 1 Drawing Sheet

OTHER PUBLICATIONS

*Comprehensive Organometallic Chemistry*, vol. 4, G. Wilkinson et al., eds., Pergamon Press, Oxford (1982) (Table of Contents, pp. 243–244, 331, 377, 513, 691–692, 821, 967–968) (no month).

F. W. Grevels et al., *J. Am. Chem. Soc.*, 103, 4069 (1981) (no month).

W. J. Carter et al., *Inorg. Chem.*, 21, 3955 (1982) (no month).

M. Green et al., *J. Chem. Soc., Dalton Trans.*, 939 (1975) (no month).

I. P. Herman, *Chem. Rev.*, 89, 1323 (1989) (no month).

A. N. Nesmeyanov et al., *J. Organomet. Chem.*, 47, 1 (1973) (no month).

T. M. Besmann et al., *Science*, 253, 1104 (1991) (no month).

J. Elizinga et al., *J. Org. Chem.*, 45, 3957 (1980) (no month).

S. B. Butts et al., *J. Organomet. Chem.*, 169, 191 (1979) (no month).

G. Dettlaf et al., *J. Organomet. Chem.*, 108, 213 (1976) (no month).

CHEMICAL VAPOR DEPOSITION OF IRON, RUTHENIUM, AND OSMIUM

This invention was made with Government support under Grant No. NSF/ECD-8 721551. The U.S. Government has certain rights in the invention.

FIELD OF THE INVENTION

This invention relates to chemical vapor deposition of films of the group VIII metals, iron, ruthenium, and osmium. The invention particularly relates to chemical vapor deposition of ruthenium and osmium and describes new compositions useful in said depositions. The invention is also directed to improved chemical vapor deposition methods for group VIII metals wherein films of very high quality can be formed at high deposition rates and low temperatures.

BACKGROUND OF THE INVENTION

Vapor Deposition (to be referred to as "CVD" hereinafter) is a widely-used method for depositing a thin film on a substrate. CVD has been extensively described in the literature, including in the patent literature, and has been comprehensively reviewed by C. E. Morosanu in "Thin Films by Chemical Vapor Deposition", Elsevier, New York (1990).

In CVD, a heat decomposable volatile compound (often an organometallic compound), which may be called the precursor, is contacted with a substrate which has been heated to a temperature above the decomposition temperature of the compound. A coating forms on the substrate which may be a metal, metal mixture or alloy, ceramic, metal compound or mixture thereof and the like, depending on the choice of precursors and reaction conditions.

The desirable characteristics of CVD as a thin film formation method can include its ability to produce a thin film with good step coverage on a substrate having projections, the ability to readily control the composition of the thin film, and the ability to form a thin film without contamination of, or damage to, the substrate.

The deposition of metals from the vapor phase is important in many industries, including the electronics industry. In this industry, metallic depositions are often undertaken involving metals such as aluminum, copper, silver, gold, and tungsten. In particular, these metals are often used for interconnection lines for semiconductor chips, circuits, and packages. For microelectronic applications, it is often desirable to deposit films having high conductivity, which typically means that the films must have minimal carbon and oxygen contamination.

In the electronics and other industries, there is a growing need for volatile sources of different metals to be used in the CVD of metallic films, metal oxide films, metal silicide films, and the like. The key property required for such metal sources is that they readily evaporate or sublime to give a metal-containing vapor or gas, with or without the use of an additional carrier gas, which vapor or gas can be decomposed in a controlled manner to deposit a film onto a target substrate.

Another use of CVD is to deposit films of metals into vias, trenches, and other recesses or stepped structures. Since it is the situation that the deposition must often occur onto substrates which have irregular topography, a technique is needed to provide conformal deposition, i.e., deposition of continuous layers over irregular substrates. When conformal thin-film deposition is required, techniques such as evaporation and sputtering (which are line-of-sight techniques) cannot be used. Thus, CVD techniques are highly preferred for this purpose.

While CVD techniques have been described with reference to many transition metals and to certain other metals (such as copper) and metalloids (such as silicon), commercial use of CVD for the most part has been confined to deposition of a few metals and metal compounds, such as silicon, tungsten, and for the co-deposition of certain III-V and II-VI compounds (denoting, respectively, a compound of a Group III metal and a Group V element, and a compound of a Group II metal and a Group VI element) such as GaAs and ZnSe.

CVD of other metals has not been extensively practiced due to a variety of reasons including poor film quality, requirement of high processing temperatures, incorporation of impurities and other defects in the deposited film, lack of suitable precursor compounds, the inability to transport vapors of the metal complex without decomposition of the vapors, and the instability of the precursors used in the deposition systems. The availability of suitable volatile and heat decomposable compounds appears to be the greatest limiting factor in the application of CVD to the production of metal containing films.

In addition to the deposition of metal films, formation of transition metal oxide coatings on substrates by CVD is known. For example, see U.S. Pat. Nos. 3,914,515 and 4,927,670 describe depositing transition metal oxide films by contacting a cyclopentadienyl metal compounds with heated substrates in the presence of an oxidizing gas.

Chapter III-2 by W. Kern et al., in "Thin Film Processes", J. L. Vossen et al., eds., Academic Press, New York (1978) at pages 258-331 provides a general discussion of CVD of thin films with specific reference to metal oxide films on pages 290-297. Such metal oxide coatings are useful in photomasks, insulators, semiconductors, high temperature superconductors, and transparent conductors, and as protective coatings for high temperature materials.

A CVD method for forming films of refractory metals would overcome some of the problems associated with the use of volatile metals such as aluminum in the manufacture of high density circuitry. Ruthenocene, $(C_5H_5)_2Ru$, has been used in the CVD of ruthenium films (D.E. Trent et al. *Inorg. Chem.*, 3, 1057 (1964)), but this precursor has a low volatility and requires a hydrogen carrier gas to deposit a pure film. U.S. Pat. No. 4,992,305 suggests the use of substituted ruthenocenes and osmocenes such as bis(isopropylcyclopentadienyl)ruthenium and bis(isopropylcyclopentadienyl)osmium as precursors for ruthenium and osmium CVD, but no examples are given.

Osmium tetrachloride has been used for the CVD of osmium films (S. Lehwald et al., *Thin Solid Films*, 21, S23 (1974)), but this precursor undergoes considerable decomposition at the temperatures required for its volatilization. Thus much of the precursor is lost in nonproductive reactions. Additionally, high substrate temperatures of about 1250° C. are required for the osmium deposition.

Ruthenium films have been formed by a chemical spray deposition process (J.C. Viguie et al., *J. Electrochem. Soc.*, 122, 585 (1975)). Tris(acetylacetonate)ruthenium in butanol is converted into an aerosol spray using a hydrogen/nitrogen mixture as the carrier gas.

Triruthenium dodecacarbonyl, ruthenocene, and tris(acetylacetonate)ruthenium were compared as CVD precursors in the formation of ruthenium and ruthenium oxide films by M. Green et al., in *J. Electrochem. Soc.*, 132, 2677 (1985). None of these precursors are very volatile and thus high deposition rates were not attained.

U.S. Pat. No. 4,250,210 discloses the use of tris(acetylacetonate)ruthenium and its fluorinated derivatives in the CVD of ruthenium films. The fluorinated ligands provide greater volatility and good deposition rates are achieved when the precursor is heated to over 200° C. to assist its volatilization. However, difficulties due to the stabilities of the precursors are noted and freshly prepared precursors are preferred as aged samples yield inferior coatings. Organic byproducts, presumably oligomers of the acetylacetonate ligands, with very low vapor pressures are formed and collect in the reactor. These liquid deposits represent a serious contamination problem in a production scale application of the tris(acetylacetonate)ruthenium precursors. This reference also alludes to the use of ruthenium carbonyl chloride and penta(trifluorophosphine)ruthenium as precursors for ruthenium CVD. However, these compounds are said to be unsuitable for general use because the rates of deposition of ruthenium that can be obtained are very low. Therefore, these precursors can only be used to deposit very thin coatings which exhibit poor adhesion to substrates. Additionally, ruthenium carbonyl chloride corrodes certain substrates and it is difficult to obtain a consistent product in its preparation. This lack of consistency in the product can show up as a substantially nonvolatile form of the carbonyl chloride, which decomposes before it can volatilize.

Although ruthenium thin films have been difficult to prepare, ruthenium and ruthenium oxide have been shown to have utility as electrical contact materials (R.G. Vadimsky et al., *J. Electrochem. Soc.*, 126, 2017 (1979)). Ruthenium oxide and ruthenium metal have similar electrical conductivities and both show good environmental stability. Films of ruthenium and ruthenium oxide deposited by CVD have been proposed to be useful for contact metallizations, diffusion barriers, and gate metallizations (M.L. Green et al., *J. Electrochem. Soc.*, 132, 2677 (1985)).

Ruthenium oxide electrodes, some prepared by CVD, have shown utility as working electrodes in nonaqueous solvents (D.R. Rolison et al., *J. Electrochem. Soc.*, 126, 407 (1979)). Thin film multilayer cobalt/ruthenium structures, prepared by sputtering techniques, can exhibit novel magnetic properties (S.S.P. Parkin et al., *Physical Review Letters*, 64, 2304 (1990)). In U.S. Pat. No. 4,250,210, CVD films of ruthenium on cutting tools can increase the cutting life of the tool.

CVD of iron using iron pentacarbonyl is well known in the art. This precursor is commercially available and is very volatile. However, its high volatility makes iron pentacarbonyl unsuitable for many applications, such as its use as a dopant in semiconductor manufacture (J.A. Long et al., *J. Crystal Growth*, 77, 42 (1986)).

As described by C. E. Morosanu on pages 460-475 in the previously cited book, iron CVD has shown utility in preparing garnets and ferrites useful as electronics, microelectronics, microwave electronics, optoelectronics, and the like. Additional utility has been shown in the preparation of Permalloy (Ni-Fe) magnetic films, photolithographic masks, and inorganic resists for laser and electron beam lithography.

Thus, a continuing need exists for improved organometallic precursors useful for the CVD of films of iron, ruthenium and osmium.

SUMMARY OF THE INVENTION

The present invention provides a method for applying a film comprising iron, ruthenium or osmium to the surface of a substrate comprising employing the techniques of chemical vapor deposition (CVD) to decompose a vapor comprising a compound of formula I:

$$(CO)_4ML \qquad (I)$$

or a compound of formula II:

on said surface.

M is iron (Fe), ruthenium (Ru) or osmium (Os) in the compound of formula (I) and L is a two-electron donor ligand selected from the group consisting of a phosphine $((R^1)_3P)$, a phosphite $((R^1O)_3P)$, an amine $((R^1)_3N)$, an arsine $((R^1)_3As)$, a stibene $((R^1)_3Sb)$, an ether $((R^1)_2O)$, a sulfide $((R^1)_2S)$, an olefin $((R^1)_2C=C(R^1)_2)$, an alkylidene $((R^1)_2C=)$, an acetylene $(R^1C\equiv CR^1)$, a nitrile $(R^1C\equiv N)$; an isonitrile $(R^1NC)$, and a thiocarbonyl (CS), wherein each $R^1$ is selected from H, halo, alkyl or aryl so that each L has the total number of carbon atoms set forth hereinbelow.

In the compound of formula (II), each R is selected from the group consisting of H, halo (Cl, F, Br, I), hydroxy, $(C_1-C_{10})$alkyl, $(C_1-C_{10})$perfluoralkyl and $(C_6-C_{10})$aryl, or two R groups taken together are benzo, and each M is Fe, Ru or Os. Preferably, the two M atoms are the same.

As used herein, with respect to the compounds of formula (I) or formula (II), the term "alkyl" includes branched or straight-chain alkyl, including $(C_1-C_{19})$alkyl, or $(C_3-C_{10})$cycloalkyl wherein, optionally, the carbon chain is interrupted by 1-5, preferably by about 1-2- N, non-peroxide O, S, Si or mixtures thereof, e.g., by NH or $SiH_2$. As used herein with respect to the compounds of formula (I) or (II), the term "aryl" includes $(C_7-C_{10})$aralkyl, or $(C_7-C_{10})$alkaryl, preferably phen$(C_1-C_4)$alkyl or (C -C<)alkylphenyl. The term "aryl" also includes $(C_5-C_6)$-membered "heteroaryl" wherein 1-3 of the ring carbon atoms have been replaced by N, O, S, Si or mixtures thereof. The aryl groups may also be substituted by 1-5 moieties such as halogen, preferably by F or Cl; $(C_1-C_4)$alkoxy, phenoxy or dioxymethylene, or by mixtures thereof Thus, the present method provides an improved technique for CVD wherein continuous films comprising the group VIII metals, Fe, Ru, Os, of high quality and good surface morphology can be deposited at low temperatures. Preferably, in the absence of an oxygen source, the films consist essentially of Fe, Ru or Os in that they contain only minor amounts of residual element(s) derived from the L groups, the $C_4R_4$ moiety, or the CO groups, e.g., $\leq 10\%$ of halogen, carbon, oxygen, etc. Most preferably, the films are essentially pure films of Fe, Ru, or Os.

In another aspect, the present invention provides a CVD method where the above precursors are used in combination with reactive carrier gases to deposit films of inorganic compounds such as metal oxides. Alternating layers of essentially pure metals and of metal oxides wherein the metals are the same or different, can also be deposited on a single substrate.

Another aspect of this invention provides certain precursor compounds of formulas (I) and (II) which can be used in thermal CVD and radiation beam induced CVD processes.

Another aspect of this invention provides an improved technique for the deposition of Fe, Ru, and Os containing films onto substrates of different shapes, the process providing high quality conformal deposition onto substrates of irregular topography.

Another aspect of this invention provides an improved thermal and radiation beam induced CVD process for depositing Fe, Ru, and Os, where the technique is directly applicable to the manufacture and processing of semiconductor devices and structures, being suitable for applications such as chip metallization and repair of conducting lines.

Another aspect of this invention provides an improved technique for thermal and radiation beam induced CVD of Fe, Ru, and Os where the temperature used in the deposition can be tailored to be sufficiently low that these films can be deposited on substrates whose properties are temperature sensitive, such as on organic polymers.

In yet another aspect, the present invention provides volatile, heat decomposable compositions comprising compounds of formula II where M is ruthenium or osmium and R is trifluoromethyl.

Advantages of the CVD methods of the present invention over the art include, but are not limited to:

(a) the high volatility of the precursors of formulas (I) and (II) can obviate the need for inert carrier gases;
(b) the high volatility of the precursors allows for high deposition rates;
(c) the volatility of the precursors can be readily controlled by varying the ligands (L) and substituent groups (R and R) of the precursors;
(d) high deposition (substrate) temperatures are not required;
(e) the precursors are generally air stable to the extent that they may be handled without the protection of inert atmospheres which facilitates the loading of precursors into CVD reactors;
(f) the precursors are easily handled in standard CVD apparatus;
(g) the depositions of the films can be radiation beam-induced;
(h) ruthenium films free of carbon contamination are obtained without the need of a reducing atmosphere; and
(i) osmium-containing films can be prepared at low deposition temperatures and high precursor conversion for the first time.

DETAILED DESCRIPTION OF THE INVENTION

A. Organometallic Precursors

Figure 1:
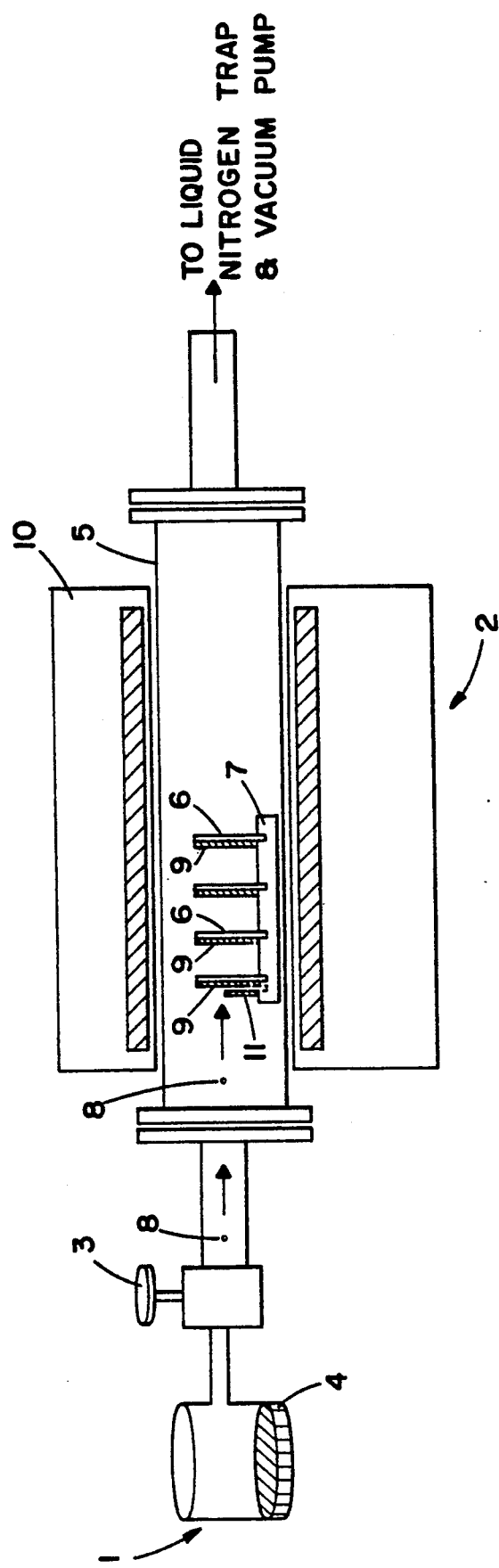
FIG. 1 is a schematic representation of a chemical vapor deposition apparatus useful in the practice of the present method.

In the present invention, organometallic precursors are chosen from
a) a compound of the formula $(CO)_4ML$, or
b) a compound of the formula (II), as depicted hereinabove. In accord with conventional organometallic nomenclature, the general structure of formula II can be abbreviated as $M_2[\mu\text{-}(\eta^2\text{:}\eta^4\text{-}C_4R_4)](CO)_6$ or $M_2(C_4R_4)(CO)_6$.

The M of formula I represents Fe, Ru, or Os and L represents a two-electron donor ligand selected from the group consisting of a trivalent amine, phosphine, arsine, and a stibene of the general formulae $(R^1)_3N$, $(R^1)_3P$, $(R^1)_3As$ or $(R^1)_3Sb$, respectively, wherein each $R^1$ is H, halo, alkyl, perfluoroalkyl or aryl, and is selected so that ligand L contains a total of about 0 to 30 carbon atoms; phosphites $((R^1O)_3P)$, wherein each $R^1$ is alkyl, perfluoroalkyl or aryl and is selected so that the phosphite contains 3 to 30 carbon atoms; a divalent ether $(R^1OR^1)$, a divalent sulfide $(R^1SR^1)$, a nitrile $(R^1CN)$, or an isonitrile $(R^1NC)$, wherein each $R^1$ is alkyl, perfluoroalkyl, or aryl and is selected so that the ether, sulfide, nitrile, or isonitrile contains 2-30 carbon atoms; an olefin $((R^1)_2C=C(R^1)_2)$, or an acetylene $(R^1C\equiv CR^1)$, wherein each $R^1$ is H, halo, alkyl, perfluoroalkyl, —CHO, —CN, $(tri(C_1\text{-}C_4)alkyl)silyl$ or aryl, and is selected so that the olefin or acetylene has 2-30 carbon atoms; thiocarbonyl (CS), or alkylidene $((R^1)_2C=)$, wherein each $R^1$ is H, alkyl, perfluoroalkyl, halo, amino or aryl and is selected so that the alkylidene has 1 to 30 carbon atoms.

Preferably, alkyl, perfluoroalkyl and aryl in group L, are as defined hereinabove for alkyl, perfluoroalkyl and aryl in the compound of formula (II). Alkylidene also includes $(C_5\text{-}C_{10})$cycloalkylidene and 5- and 6-membered heterocycloalkylidene, wherein the ring comprises 1-4 N, S, Si, non-peroxide O or mixtures thereof. Preferred $R^1$ groups include, but are not limited to, halo, $(C_1\text{-}C_4)$alkyl, $(C_1\text{-}C_4)$perfluoroalkyl, phenyl, H, CHO and mixtures thereof.

R in formula (II) preferably is hydrogen, OH, halo, $(C_1\text{-}C_6)$alkyl, $(C_1\text{-}C_6)$perfluoroalkyl, and phenyl, most preferably trifluoromethyl, phenyl or methyl. The four R groups need not be all identical and the two M groups need not be identical.

The ligands of formula I are generally known to those skilled in the art and are described by J. P. Collman and L. S. Hegedus in "Principles and Applications of Organotransition Metal Chemistry" University Science Books, Mill Valley, Calif. (1980) at pages 51–175.

Useful precursors of formula I wherein L is an acetylenic ligand include those in which L is hexafluoro-2-butyne, such as (hexafluoro-2-butyne)rutheniumtetracarbonyl, hereinafter abbreviated $Ru(hfb)(CO)_4$. This precursor has been successfully used to deposit analytically pure ruthenium coatings at temperatures between about 300 and 600° C.

A preferred precursor of formula II which is useful for the deposition of ruthenium is $Ru_2\{\mu\text{-}[\eta^2\text{:}\eta^4\text{-}C_4(CF_3)_4]\}(CO)_6$, hereinafter abbreviated $Ru_2[C_4(CF_3)_4](CO)_6$. This precursor has also been successfully used to deposit analytically pure ruthenium coatings at temperatures between about 300° and 600° C.

The synthesis of a series of monometallic alkyne tetracarbonyl complexes of group VIII metals has been reported by R.G. Ball et al., *J. Organometallics*, 6, 1918 (1987). When the alkyne is hexafluoro-2-butyne (hfb), the ruthenium and osmium complexes M(hfb)(CO)$_4$ can be prepared in good yield (M.R. Gagne et al., *J. Organometallics*, 7, 561 (1988)). A general method for the synthesis of M(hfb)(CO)$_4$ complexes comprises the photolysis of M(CO)$_5$ in the presence of the hfb ligand. The presence of trifluoromethyl groups enhances the volatility of the complexes compared to nonfluorinated analogs. The Ru(hfb)(CO)$_4$ compound has a vapor pressure between 1 and 2 torr at room temperature and thus is suitable for CVD experiments.

Heating the M(hfb)(CO)$_4$ complexes where M is Ru or Os at temperatures from about 100° C. to about 300° C. results in the formation of the novel dinuclear complexes M$_2$[C$_4$(CF$_3$)$_4$](CO)$_6$. The reactions proceed in good yield in solution or in the gas phase and formally involve the dimerization of the hfb ligands. These dimetallic complexes, despite their crystallinity and high molecular weights, sublime under vacuum and are thus suitable for CVD experiments.

Complexes of formula I where M is iron and L is phosphine, amine, phosphite, and the like are generally prepared by reaction of iron pentacarbonyl, diiron nonacarbonyl, or triiron dodecacarbonyl with the desired ligand L under the influence of heat or light as described by D.F. Shriver et al., "Iron Compounds without Hydrocarbon Ligands", Chapter 31.1 in *Comprehensive Organometallic Chemistry*, Vol. 4, G. Wilkinson et al., eds., Pergamon Press, Oxford, (1982) at pages 243–329 (hereinafter cited as *Comp. Organometal. Chem.*). Typical methods for synthesis of (CO)$_4$FeL complexes where L is carbene or alkylidene are described by M.D. Johnson "Mononuclear Iron Compounds with $\eta^1$-Hydrocarbon Ligands", Chapter 31.2 in *Comp. Organometal. Chem.*, at pages 331–376, and include conversion of a carbonyl ligand into a carbene ligand, reaction of iron pentacarbonyl with electron rich olefins, and reaction of iron carbonyl anions with organic cations.

Typical methods for synthesis of (CO)$_4$FeL complexes where L is alkene and alkyne are described by A.J. Deeming in Chapter 31.3 in *Comp. Organometal. Chem.*, at pages 377–512, and include reaction of diiron nonacarbonyl or triiron dodecacarbonyl with an alkene, photolysis of iron pentacarbonyl in the presence of an alkene or alkyne, nucleophilic addition to the allyl ligand of Fe(CO)$_4$(allyl)$^+$, and reaction of alkynes with FeH(CO)$_4^-$ followed by protonation.

When M is ruthenium, complexes of formula I may be prepared by thermal or photolytic reaction of ruthenium pentacarbonyl or triruthenium dodecacarbonyl with ligands such as phosphines as described by M.A. Bennett et al., in Chapter 32.3 of *Comp. Organometal. Chem.*, at pages 691–820. Displacement of olefin from (CO)$_4$Ru(olefin) complexes by ligands such as trimethyl phosphite is another general route to (CO)$_4$RuL complexes (F.-W. Grevels et al. *J. Am. Chem. Soc.*, 103, 4069 (1981)).

When M is osmium, complexes of formula I may be prepared by thermal reaction of cis-Os(CO)$_4$(H)CH$_3$ with ligands such as ethylene and triethylphosphine as disclosed by W.J. Carter et al., in *Inorg. Chem.*, 21, 3955 (1982) or by photolysis of triosmium dodecacarbonyl in the presence of ligand (R.G. Ball et al., *J. Organometallics*, 6, 1918 (1987)). Reactions of Os(CO)$_4^{-2}$ with thiazolium salts lead to (CO)$_4$OsL complexes where L is a carbene ligand (M. Green et al., *J. Chem. Soc., Dalton Trans.*, 939 (1975)).

Complexes of formula II where M is iron may be prepared by the thermal reaction of acetylenic compounds with iron pentacarbonyl, Fe(CO)$_3$($\eta^4$-benzalacetone), diiron nonacarbonyl, or triiron dodecacarbonyl as described by W.P. Fehlhammer et al., Chapter 31.4 in *Comp. Organometal. Chem.*, at pages 513–613. The corresponding ruthenium analogs are prepared by reaction of triruthenium dodecacarbonyl with alkynes or butadienes as described by M.A. Bennett et al. Chapter 32.4 in *Comp. Organometal. Chem.*, at pages 821–841. The corresponding osmium analogs are prepared by reaction of Os$_3$(H)$_2$(CO)$_{10}$ or Os$_3$(CO)$_{12}$ with acetylenes or dienes as described by R.D. Adams et al., Chapter 33 in *Comp. Organometal. Chem.*, at pages 967–1064.

The precursor complexes of formula I and formula II may vary in their air and thermal stability depending on the ligands and substituent groups incorporated into the complexes. The air stability of complexes of formula I and II are generally quite good allowing the complexes to be handled without the need to employ inert atmospheres such as nitrogen or argon. This is important in commercial application of these precursors as the need for inert atmosphere increases the operating costs and capital equipment costs for any CVD process.

The ability to easily vary the ligand L of complexes of formula I and the R groups of complexes of formula II provides an exceptional degree of control over both the volatility and deposition temperature for the precursors of the present invention. For example, Fe(CO)$_4$[P(C$_6$H$_5$)$_3$] melts at about 201° C. and sublimes at about 100° C. which makes it distinctly less volatile than Fe(CO)$_4$[P(OCH$_3$)$_3$] which melts at about 45° C. and sublimes at room temperature. The choice of ligands in formula I and substituent groups in formula II has an effect on the electron density at the metal centers of these complexes. This in turn effects the thermal stability of the precursor complexes which determines the deposition temperature for a given precursor complex. The ability to control both the deposition rate (through precursor volatility) and the deposition temperature (through precursor stability) with one variable, L or R, greatly facilitates precursor design for the CVD of iron, ruthenium, and osmium.

Illustrative examples of precursor complexes of formula I include tetracarbonyl(trichlorophosphine)iron, tetracarbonyl(trifluorophosphine)iron, tetracarbonyl(phosphine)iron, tetracarbonyl(thiocarbonyl)iron, tetracarbonyl(diaminomethylene)iron, tetracarbonyl(tetrafluoroethylene)iron, tetracarbonyl(chloroethylene)iron, tetracarbonyl(isocyanomethane)iron, tetracarbonyl(ethylene)iron, tetracarbonyl(cyanoethylene)iron, tetracarbonyl(acrolein)iron, tetracarbonyl(1,4-dimethyltetrazolin-5-ylidene)iron, tetracarbonyl(trimethylarsine)iron, tetracarbonyl(trimethylphosphine)iron, tetracarbonyl(trimethylstibine)iron, tetracarbonyl(trimethylamine)iron, tetracarbonyl(trimethylphosphite)iron, tetracarbonyl(1,3-dithiane)iron, tetracarbonyl(1,3-dimethyl-2-imidazolidinylidene)iron, tetracarbonyl(isocyanobenzene)iron, tetracarbonyl(styrene)iron, tetracarbonyl(di-t-butylacetylene)iron, tetracarbonyl[bis(trimethylsilyl)ethyne]iron, tetracarbonyl(triphenylarsine)iron, tetracarbonyl(triphenylphosphine)iron, tetracarbonyl(triphenylstibine)iron, tetracarbonyl(triphenylphosphite)iron, tetracarbonyl(- trifluorophoshine)ruthenium, tetracarbonyl(acrylonitrile)ruthenium, tetracarbonyl(triphenylphosphine)ruthenium, tetracarbonyl(trimethylphosphite)ruthenium, tetracarbonyl(trimethylphosphine)ruthenium, tetracarbonyl[3,4-dimethyl-2(3H)-thiazolylidene]osmium, tetracarbonyl(ethylene)osmium, tetracarbonyl[bis(trimethylsilyl)ethyne]osmium, tetracarbonyl(trimethylphosphite)osmium, tetracarbonyl(trifluorophoshine)osmium, tetracarbonyl(triethylphosphine)osmium, and tetracarbonyl(triphenylphosphine)osmium.

Illustrative examples of precursor complexes of formula II include hexacarbonyl[$\mu$-($\eta^2$:$\eta^4$-(3,5-cyclohexadiene-1,2-diylidenedimethylidyne)]diiron, hexacarbonyl[$\mu$-($\eta^2$:$\eta^4$-1,2-ethenediyl-1,2-phenylene]diiron, hexacarbonyl[$\mu$-($\eta^2$:$\eta^4$-1,2,3,4-tetramethyl-1,3-butadiene-1,4diyl)]diiron, hexacarbonyl[$\mu$-($\eta^2$:$\eta^4$-1,3-butadiene-1,4diyl)]diiron, hexacarbonyl[$\mu$-($\eta^2$:$\eta^4$-1,4-dihydroxy-1,3-butadiene-1,4-diyl)]diiron, hexacarbonyl[$\mu$-($\eta^2$:$\eta^4$-1,2-ethenediyl-1,2-phenylene)]diruthenium, hexacarbonyl[$\mu$-($\eta^2$:$\eta^4$-1,2,3,4-tetramethyl1,3-butadiene-1,4-diyl)]diruthenium, hexacarbonyl[$\mu$-($\eta^2$:$\eta^4$-1,2,3,4-tetraphenyl-1,3-butadiene-1,4-diyl)]diruthenium, tricarbonyl[$\mu$-($\eta^2$:$\eta^4$-1,2,3,4-tetraphenyl-1,3-butadiene-1,4diyl)](tricarbonyliron)ruthenium, hexacarbonyl[$\mu$-($\eta^2$:$\eta^4$-1,3-butadiene-1,4-diyl)]diosmium, hexacarbonyl[$\mu$-($\eta^2$:$\eta^4$-1,2,3,4-tetramethyl-1,3-butadiene-1,4-diyl)]diosmium, and hexacarbonyl[$\mu$-($\eta^2$:$\eta^4$-1,2-ethenediyl-1,2-phenylene)]diosmium.

B. Substrates

Any type of substrate can be used, including metals, graphite, semiconductors, insulators, ceramics and the like as long as the substrate is not substantially deteriorated under the deposition conditions Such substrates include, but are not limited to, silicon, tin oxide, gallium arsenide (GaAs), silica, glass, alumina, zirconia, as well as polyimide, polymethyl-methacrylate, polystyrene and other synthetic polymers More specifically, substrates useful for electronic device applications include Si<100>, Si<311>, Si<111>, Si<110>, GaAs<110>, GaAs<111> and GaAs<311>.

Although the exemplified substrate surfaces are planar, the present process can provide conformal deposition so that the metals can be deposited as continuous layers into recesses, trenches, and vias, and over stepped surfaces, such as those which are topologically microstructured. The substrate can be of any desired shape, either regular or irregular. Thus, the substrate can be a rectangular solid or other solid characterized by flat exterior surfaces. Cylindrical surfaces, such as rods and wires, can also be coated according to this invention. Spherical surfaces and other curved surfaces can also be coated. The substrate can even be particulate and/or be hollow, as for example, a tube or a hollow or porous sphere or irregular particle having openings to the exterior.

C. Chemical Vapor Deposition

This invention broadly relates to the use of the technique of CVD to deposit high quality metal-containing films of group VIII metals, and specifically films of Ru and Os, at low temperature on a wide variety of substrates. As described by C.E. Morosanu in "Thin Films by Chemical Vapor Deposition,"Elsevier, N.Y. (1990) at pages 42-54, CVD is classified into various types in accordance with the heating method, gas pressure, and-/or chemical reaction. For example, conventional CVD methods include (a) cold wall type CVD, in which only a deposition substrate is heated; (b) hot wall type CVD, in which an entire reaction chamber is heated; (c) atmospheric CVD, in which reaction occurs at a pressure of about one atmosphere; (d) low-pressure CVD in which reaction occurs at pressures from about $10^{-1}$ to 100 torr; (e) electron-beam assisted CVD and ion-beam assisted CVD in which the energy from an electron-beam or an ion-beam directed towards the substrate provides the energy for decomposition of the precursor; (f) plasma assisted CVD and photo-assisted CVD in which the energy from a plasma or a light source activates the precursor to allow depositions at reduced substrate temperatures; and (g) laser assisted CVD wherein laser light is used to heat the substrate or to effect photolytic reactions in the precursor gas.

The laser CVD method is thoroughly discussed by I.P. Herman, *Chemical Reviews*, 89, 1323 (1989). Pyrolytic depositions are discussed on pages 1346-8 and photolytic depositions are discussed on pages 1348-9 of this review. An example of ion-beam assisted CVD is found in U.S. Pat. No. 4,876,112. An example of photo-assisted CVD is found in U.S. Pat. No. 5,005,519. An example of laser assisted CVD is found in U.S. Pat. No. 4,340,617. An example of electron-beam assisted CVD is found in U.S. Pat. No. 4,713,258. An example of plasma assisted CVD is found in U.S. Pat. No. 4,721,631. Examples of low pressure CVD and hot wall CVD are found in U.S. Pat. No. 4,923,717. An example of atmospheric CVD is found in U.S. Pat. No. 5,022,905. Examples of low pressure CVD and cold wall CVD are found in U.S. Pat. No. 4,868,005. Heating of substrates in a cold wall CVD reactor may be accomplished by several methods including the use of hot stages or induction heating.

Broadly, thermal CVD includes any type of apparatus in which the substrate and/or the gaseous precursor is heated and could include standard thermal reactors such as cold wall/hot substrate reactors and hot wall type reactors, as well as radiation beam reactors in which a beam (such as a laser beam) is used to heat the substrate and/or to decompose gaseous precursor.

D. The CVD Process

In a typical CVD process, the substrate on which deposition is to occur is placed in a reaction chamber, and is heated to a temperature sufficient to cause the decomposition of vapors of the precursor complex. When these vapors are introduced into the reaction chamber and transported to the vicinity of the substrate, they will decompose thereon to deposit a film containing the group VIII metal. It is believed that the decomposition includes the initial dissociation of a carbonyl ligand, followed by sequential or concerted loss of the remaining ligands.

In a thermal reactor CVD system, it is preferable that the decomposition reaction occur at the substrate, and for this reason it is preferable to heat the substrate to a temperature in excess of the decomposition temperature of the precursor complex. In a radiation beam induced CVD technique, the radiation (such as an ion beam) is preferably used to heat the substrate so that decomposition of the precursor occurs at the substrate.

These CVD processes can be used to provide blanket deposition of Fe, Ru, and Os on substrates, as well as to provide deposition of these metals on selected areas of the substrate, i.e., by use of a masking material, such as a resist material. Additionally, selected area depositions may be accomplished by energy beam assisted CVD where a beam of energy, such as an ion beam, selectively heats small portions of the substrate.

Any CVD apparatus design may be used in the present invention including hot wall reactors, cold wall reactors, radiation beam assisted reactors, plasma assisted reactors, and the like. For blanket depositions, a cold wall-hot substrate reactor may sometimes be preferred as this design is efficient in regards to precursor consumption. For selected area depositions, a radiation beam assisted reactor may be preferred as the radiation beam may be used to "write" metal containing films onto small areas of the substrate.

As embodied herein, the growth of Fe, Ru and Os films is conducted without a carrier gas, and under a dynamic vacuum of about 1-10 mtorr in a standard hot-wall, horizontal tube CVD reactor. Such a reactor (2), adapted for low pressure CVD, is schematically depicted in FIG. 1.

As shown in FIG. 1, the precursor is contained in a reservoir (1), at one end of the reactor (2), is exposed to a vacuum by opening valve (3) and vaporized for a sufficient time to produce a surface coating (9) of Fe, Os or Ru on substrate (6). The vacuum can be provided by a suitable vacuum pump positioned at the opposite end of reaction chamber (5) (not shown). The precursor vapor (8) then passes into a reaction chamber (5) that contains one or more units of the substrate (6). The substrate, e.g., wafers of $Si<100>$, are preferably held in a vertical position by a suitable holder (7). The reaction chamber is maintained at a preselected temperature, by means of an external furnace (10), which is effective to decompose the precursor vapor (8) so as to deposit a film of Os, Ru or Fe (9) on the exposed surfaces of the substrate units. Preferably, the reaction chamber is maintained at about 150°-700° C. during the deposition process, most preferably at about 300°-600° C.

Generally, vacuum systems are used for CVD of these metals. There is no criticality with respect to the pressure in the system, operating pressures of 1 to 100 mtorr have been used in the absence of carrier gas and higher or lower pressures are also acceptable, i.e., up to about 2 torr. These pressures are largely determined by the pumping speed of the vacuum equipment, the vapor pressure of the precursor complex, and inert carrier gasses can be added to increase the total pressure.

Although it is preferred to conduct the present process without a carrier gas, it is often desirable to use a carrier gas in a CVD process, which is passed through or over a solid or liquid precursor. This is especially true when a metal compound deposition rather than a pure metal deposition is required. In this case, a reactive carrier gas such as an oxygen-containing carrier gas (air, oxygen or nitrous oxide), or ammonia, silane, hydrogen sulfide, and the like or combination of inert and reactive carrier gases may be used. When carrier gases are used pressures may range from about 0.1 torr to about 760 torr (atmospheric pressure) and are more typically in the range of 20 to 300 torr. However, this pressure does not appear to be highly critical to the deposition of the films.

The precursor is generally maintained at a constant temperature during the vaporization process for ease of handling; however, this is not critical. The temperature is generally below the respective decomposition temperature, but at a temperature such that it is sufficiently capable of being volatilized in the process of chemical vapor deposition.

Prior to initiating CVD, the substrates, such as $Si<100>$ wafers, are pre-cleaned by the standard means of sequential soaking in baths of tetrachloroethane, methanol, distilled water, dilute hydrofluoric acid, and distilled water. The wafers are placed at several locations towards the entrance to the reactor tube, where there is a steep rise in temperature. At 500° C. exposure of the wafers to the vapors of $Ru(hfb)(CO)_4$ for three minutes, produces a film having a thickness of 1800Å as determined by stylus profilometry. The films are smooth and highly reflective to visual inspection and have a color nearly identical to that of the silicon substrate.

When the temperature of the deposition is lowered to 300° C., the rate of film deposition is decreased and a yellow crystalline solid is observed condensing on the walls of the cooler portions of the reactor. This solid was determined to be a new compound, which was completely characterized using analytical and spectroscopic methods and was determined to be $Ru_2[C_4(CF_3)_4](CO)_6$. This compound results from loss of CO and coupling of the alkyne ligands from two equivalents of $Ru(hfb)(CO)_4$.

Within the iron triad, numerous examples of this structural type are known. See, A.N. Nesmeyanov et al., *J. Organomet. Chem.*, 47, 1 (1973). The dimetallic $Ru_2[C_4(CF_3)_4](CO)_6$ complex can also be synthesized by heating a toluene solution of $Ru(hfb)(CO)_4$ at reflux for 3 hr. The observation that this chemistry occurs equally well both in toluene solution (where surface effects should be minimized) and in the vacuum pyrolysis suggests that the initial chemistry in the CVD process takes place in the gas phase as shown in the following equation.

$$Ru(hfb)(CO)_4 \rightarrow Ru(hfb)(CO)_3 + CO$$

At temperatures where $Ru(hfb)(CO)_3$ has a long enough lifetime to collide with another complex, presumably $Ru(hfb)(CO)_4$, formation of the dinuclear complex may be favored as shown in the following equation.

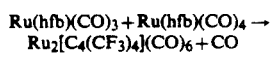

$$Ru(hfb)(CO)_3 + Ru(hfb)(CO)_4 \rightarrow$$
$$Ru_2[C_4(CF_3)_4](CO)_6 + CO$$

At higher temperatures further ligand loss from $Ru(hfb)(CO)_3$ is predominant leading to metallic films of ruthenium as shown in the following equation.

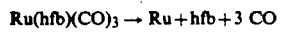

$$Ru(hfb)(CO)_3 \rightarrow Ru + hfb + 3\,CO$$

Similar chemistry is believed to occur for the iron and osmium analogs.

With $Os(hfb)(CO)_4$, slightly higher deposition temperature and slightly longer deposition times are required than those used with $Ru(hfb)(CO)_4$. For example, at 600° C., a 1500Å thick film of osmium is formed in ten minutes.

Smooth, reflective iron films which adhere well to $Si<100>$ substrates are also produced by the present invention. Both $Fe(CO)_4[N(CH_3)_3]$ and $Fe(CO)_4[P(OCH_3)_3]$ yield iron films which contain varying amounts of carbon and oxygen as determined by Auger electron spectroscopy. The depositions are carried out at temperatures from 150° to 500° C. Trace amounts of nitrogen are detected in films deposited from $Fe(CO)_4[N(CH_3)_3]$ at low temperatures and phosphorous is r present in films deposited from $Fe(CO)_4[P(OCH_3)_3]$.

Thus, the molecular composition of precursors may be used as a means of introducing other elements into the deposited metal films.

Although its volatility is significantly less than Ru(hfb)(CO)$_4$, ruthenium films can be prepared at 600° C. using Ru$_2$[C$_4$(CF$_3$)$_4$](CO)$_6$. A ten-minute deposition gives reflective, smooth, adherent ruthenium films on Si<100> substrates. These films contain no detectable carbon and only traces of oxygen and fluorine. Depositions from Os$_2$[C$_4$(CF$_3$)$_4$](CO)$_6$ can provide osmium films in an analogous manner.

The readily available iron compounds of formula II are also effective precursors to iron films. The crystalline Fe$_2$(C$_4$H$_4$)(CO)$_6$ compound is air stable and easily handled by standard techniques. The compound also sublimes easily and is thus suitable for CVD studies. At 500° C., Fe$_2$(C$_4$H$_4$)(CO)$_6$ rapidly deposits smooth, adherent films containing iron on silicon substrates. Deposition from the precursors of formula II is also believed to involve initial loss of a carbonyl ligand followed by sequential or concerted loss of the remaining ligands. The precursors of formula II contain a metal-to-metal bond which may remain intact during the deposition sequence.

Although the precursor complexes M(hfb)(CO)$_4$ and M$_2$[C$_4$(CF$_3$)$_4$](CO)$_6$ contain relatively high levels of fluorine in their atomic composition, metallic films deposited from these materials contain undetectable or only trace amounts of fluorine as determined Auger electron spectroscopy.

Trapping the volatile byproducts from a Ru(hfb)(CO)$_4$ CVD experiment is accomplished using a liquid nitrogen cooled U-tube filled with glass beads. The trapped products are distilled into a NMR tube which is sealed under vacuum. After obtaining a $^{19}$F NMR spectrum, the contents of the tube are further analyzed using GC-MS-FTIR. These methods establish that the majority of the material is hexafluoro-2-butyne. Thus, the hfb ligand can be readily trapped for reuse in the present method. The gas chromatogram also shows the elution of two smaller, less well-resolved peaks immediately following the elution of hfb. The highest mass values for these two peaks are m./e = 362 and 324, respectively. These values and the associated fragmentation patterns correspond to the formulas C$_8$F$_{14}$ and C$_8$F$_{12}$ which may result from decomposition of Ru$_2$[C$_4$(CF$_3$)$_4$](CO)$_6$.

Metal oxide coatings can be formed by using as precursor a compound of formula I or II which yields the desired metal on decomposition. The precursor is contacted with a heated substrate in the presence of an oxidizing agent, which is preferably a mildly oxidizing gaseous oxygen source. The oxidizing agent may also be any gaseous reactant which is capable of reacting with the organometallic precursor compounds at the decomposition temperatures of the latter to form metal oxide deposits. Oxygen-containing compounds, such as nitrous oxide, carbon dioxide, THF (tetrahydrofuran) and steam can be used in some cases, in place of oxygen or air for the deposition of metal oxides and oxygen-containing salts since the oxygen compounds react with the organometallic precursors only at high temperatures. The oxidizing agent may be introduced into the reactor in admixture with a carrier gas. For example, nitrous oxide/nitrogen oxidizing mixtures are suitable.

Group VIII metal oxide films are produced by the present method. Deposition from Ru(hfb)(CO)$_4$ give adherent, metallic ruthenium oxide films on Si<100> substrates when the depositions are carried out in oxidizing atmospheres of air or oxygen. Auger electron spectroscopy shows the concentration of oxygen to be constant throughout the depth of the film demonstrating that the oxygen is incorporated from the deposition atmosphere and does not merely result from post deposition exposure of the films to air. Quantification of the ruthenium, oxygen, and carbon levels in the ruthenium oxide films is difficult, since oxygen affects the ruthenium signals in the Auger electron spectrum (M.L. Green et al., *J. Electrochem. Soc.*, 132, 2677 (1985)).

Alloys, metal mixtures and intermetallic compounds can also be deposited in accordance with this invention, by contacting one or more precursor compounds of formula I or II and one or more additional heat decomposable precursor compounds which yield the desired additional metals or metalloids on decomposition. Preferably, the deposition is carried out under nonoxidizing or reducing conditions. An example of an additional heat decomposable precursor is diethylselenide. The term, "metalloid", as used herein refers to a solid nonmetallic element and includes arsenic, antimony, boron, germanium, phosphorus, selenium, silicon, sulfur, and tellurium.

As will be seen from the examples to follow, high quality metal films can be deposited with thicknesses dependent upon the time and temperature of deposition. Products of this invention may have any desired coating thickness ranging from monomolecular up to about one millimeter. A preferred range of thickness is from about 0.01 to about 100 microns, especially from about 0.1 to about 20 microns. Films having a thickness of about 0.1 microns and more are most suitable for device purposes.

Coating thickness can also be controlled by controlling the flow rate of the vapor of the organometallic precursor, the volatility of the organometallic precursor, and the length of time over which these compounds are contacted with substrate.

Products of this invention may be characterized as composite articles having a metal containing coating thereon. Single layer coatings, usually of substantially uniform composition throughout, can be achieved with any of the processes described herein. Precursors of the present invention are also useful in molecular beam epitaxy (MBE) and chemical beam epitaxy (CBE) processes. In these processes, multilayer structures of well defined composition and sharp interfacial boundaries are typically produced. Multiple layer coatings having different compositions are best achieved with MBE or CBE. The electrical conductivity of thin films generally increases as the thickness increases due to the reduction of electron scattering in the grain boundaries, which is a property of the metals.

Metals and metal compounds deposited by the present invention also have utility as abrasion resistant coatings for cutting tools and the like, as interconnection traces for microelectronic devices, as corrosion resistant coatings, as magnetic coatings, as contact metallizations, as electrode materials, as semiconductor dopants, and the like. The CVD precursors of the present invention have additional utility in the related process of chemical vapor infusion, typically referred to as CVI, in which a volatile, decomposable material infuses into and onto porous substrates where they are decomposed. See T.M. Besmann et al., *Science*, 253, 1104 (1991). Material thus treated is useful as, for example, continuous-filament ceramic composites and heterogeneous catalysts.

The invention will be further illustrated by the following detailed examples, but the particular materials and amounts thereof recited in these examples, as well as other conditions and details should not be construed to unduly limit this invention.

EXAMPLE 1

Ru(hfb)(CO)$_4$ was prepared by the method of M.R. Gagne et al., *J. Organometallics*, 7, 561 (1988), and 0.25 g was placed in a glass flask that was fitted with a capacitance manometer and a side arm incorporating a stopcock to allow the flask to be attached to a vacuum line. The manometer fitting also incorporated a stopcock to allow the manometer to be isolated from the rest of the system. The flask was sealed, attached to a vacuum line, and cooled to $-196°$ C. by external application of a liquid nitrogen bath. The entire flask was evacuated to 1 mtorr while maintaining the $-196°$ C. temperature. The stopcocks leading to the manometer and vacuum line were closed and the flask allowed to warm to 25° C. The stopcock leading to the manometer was then opened and the pressure due to the vaporizing Ru(hfb)(CO)$_4$ monitored for 20 minutes. This procedure was repeated three times and the average value for the vapor pressure of Ru(hfb)(CO)$_4$ at 25° C. was 1.5 torr. This example shows Ru(hfb)(CO)$_4$ is of a suitable volatility for CVD processes and that the material may be handled in standard glass vacuum apparatus.

EXAMPLE 2

The reactor employed in the low pressure chemical vapor deposition of Ru was a standard hot-wall quartz reactor system (2) equipped with a precursor pot, a rotary vane oil vacuum pump, vacuum trap, and tube furnace and was similar to that described in U.S. Pat. No. 4,923,717, and depicted in FIG. 1. The quartz reactor tube (5) had an inside diameter of 2.6 cm and a length of 35 cm. The temperature of the reactor was monitored by a thermocouple placed between the furnace heating elements (10) and the outside wall of the quartz reactor tube (5) at a position directly below the location of the substrates (6). The substrates (6) were placed in a vertical holder (7) between 1 to 5 cm from the edge of the furnace. The Si<100> substrates (Mycosil Company, Milpitas, Calif.) were degreased and etched by sequential immersion in the following baths for 10 min each: tetrachloroethane, methanol, distilled water, dilute hydrofluoric acid, and distilled water. The substrates were placed in the reactor tube, and the system evacuated to approximately 1 mtorr. The substrates were heated to the deposition temperature (500° C.) for 30 minutes prior to beginning the deposition. The valve (3) to the reservoir (1) containing Ru(hfb)(CO)$_4$ (4) was opened for 3 min to bring Ru(hfb)(CO)$_4$ vapor (8) into contact with the substrate wafers (6). A highly reflective, smooth, adherent coating of metallic Ru (9) was formed on the substrate. This example shows that Ru(hfb)(CO)$_4$ is an effective CVD precursor for ruthenium-containing films, that standard CVD equipment may be used, and that carrier gases and ultra-high temperatures are not required.

EXAMPLE 3

The CVD apparatus described in Example 2 was equipped with a liquid nitrogen cooled, glass bead filled U-tube trap located down stream of the reactor furnace. The U-tube trap incorporated a side arm with a ground glass joint and a stopcock to allow sampling of the trapped material. The U-tube trap also incorporated stopcocks which allow the trap to be removed from the CVD reactor system without exposing the contents to ambient atmosphere. A deposition using Ru(hfb)(CO)$_4$ was carried out as described in Example 2 to yield ruthenium metal films. The U-tube trap was removed from the system and the trapped volatile products distilled into an NMR tube containing benzene-d$_6$. The $^{19}$F NMR spectrum of this material contained one major peak at $-53.2$ ppm relative to CFCl$_3$. A portion of the material from the NMR tube was analyzed by GC-MS-FTIR and the major component had a molecular ion peak at a mass of 162 and C-F stretching bands at 1183-1286 cm$^{-1}$. An authentic sample of hexafluoro-2-butyne (PCR Incorporated, Gainesville, Fla.) had identical $^{19}$F NMR, MS, and IR spectra to the major component of the above trapped volatiles. This example shows that the major volatile byproduct from CVD with Ru(hfb)(CO)$_4$ is hexafluoro-2-butyne and that the free ligand is readily trapped for reuse in the synthesis of Ru(hfb)(CO)$_4$ and subsequent film depositions.

EXAMPLE 4

Deposition from Ru(hfb)(CO)$_4$ was carried out as in Example 2 except that portions of the silicon substrates were masked by placing a small piece of silicon directly in front of the substrate such that a corner of the substrate is covered, as shown in FIG. 1 as (11). The resulting ruthenium films had sharp boundaries suitable for thickness measurements by stylus profilometry. A film thickness of 1800Å was observed for a three-minute deposition at 500° C. which gives a deposition rate of 60 nm/min.

EXAMPLE 5

Deposition from Ru(hfb)(CO)$_4$ was carried out as in Example 2 and the resulting ruthenium films were analyzed by Auger electron spectroscopy (AES). The films were Ar$^+$ sputtered for 5 minutes to remove surface contaminants resulting from atmospheric exposure. The Auger spectrum showed a 1% oxygen content of the film. Direct measurement of the carbon content was not possible by AES due to the overlap between the carbon KLL line at 271 eV and the ruthenium MNN line at 273 ev. The ratio of the intensities of the ruthenium transitions located at 273 and 231 eV may be used as a gauge of the carbon content in ruthenium thin films (M.L. Green et al., *J. Electrochem. Soc.*, 132, 2677 (1985)). In a bulk ruthenium, the $I_{273}/I_{231}$ ratio is 2.64. In the films of this example grown from Ru(hfb)(CO)$_4$, the $I_{273}/I_{231}$ ratio is also 2.64. This indicates that the carbon content is below the limits of detection. No fluorine lines is observed in the AES of the CVD films of this example. This example shows the ruthenium films prepared by CVD from Ru(hfb)(CO)$_4$ are of high purity.

EXAMPLE 6

Deposition from Ru(hfb)(CO)$_4$ was carried out as in Example 2 and the resulting ruthenium films analyzed by X-ray diffraction (XRD), scanning electron microscopy (SEM), and resistivity measurements. XRD showed that the films have a hexagonal structure and are polycrystalline with no preferential orientation. SEM of the surface of the visually smooth, mirror-like films revealed a grainy morphology with individual grain sizes of approximately 30 nm or less. The resistivity of the films was measured by a standard four-point probe method and yielded a value of 160 $\mu\Omega$/cm. The value for the resistivity of bulk ruthenium is 7.6 $\mu\Omega$/cm.

EXAMPLE 7

Using the reactor system described in Example 2, osmium thin films were deposited on Si<100> wafers from Os(hfb)(CO)$_4$ which was synthesized as disclosed by M.R. Gagne et al., *J. Organometallics*, 7, 561 (1988). The deposition was performed without a carrier gas under a dynamic vacuum of approximately 1 mtorr at 600° C. for 10 min. A highly reflective smooth adherent coating of metallic Os formed on the substrate. This example shows that Os(hfb)(CO)$_4$ is an effective CVD precursor for osmium-containing films, that standard CVD equipment may be used, and that carrier gases and high temperatures are not required.

EXAMPLE 8

Deposition from Os(hfb)(CO)$_4$ was carried out as in Example 7 and the resulting osmium films analyzed by XRD, SEM, stylus profilometry, and resistivity measurements. XRD showed the films to have a hexagonal structure and are polycrystalline with no preferred orientation. AES showed, after Ar$^+$ sputtering, that the carbon and oxygen content in the films is 30% and 1%, respectively. Fluorine could not be observed by AES in these films. The resistivity of the films was measured by a standard four-point probe method and gave a value of 750 $\mu\Omega$/cm; the value for the resistivity of bulk osmium is 8.1 $\mu\Omega$/cm. Stylus profilometry on a substrate which had a portion of its surface masked, showed a film thickness of 1500Å for a ten-minute deposition at 600° C. which yields a deposition rate of 15 nm/min. This example shows that the Os(hfb)(CO)$_4$ CVD precursor gives osmium films at high deposition rates. The carbon content can be lowered using hydrogen as the carrier gas.

EXAMPLE 9

Ru(hfb)(CO)$_4$ (0.797 g) was passed through the reactor system described in Example 2 at 150° C. for 30 min under a dynamic vacuum of approximately 1 mtorr. A yellow crystalline solid (0.53 g) deposited on the cooler portions of the reactor system. Spectroscopic analysis of the yellow crystalline solid showed it to be the binuclear complex Ru$_2$[C$_4$(CF$_3$)$_4$](CO)$_6$. A 72% yield of the product was obtained in this flash vacuum pyrolysis. Spectroscopic data for Ru$_2$[C$_4$(CF$_3$)$_4$](CO)$_6$: IR (cm$^{-1}$, pentane) 2117 (m), 2096 (s), 2064 (s), 2054 (s), 2037 (s), 2021 (w); $^{19}$F NMR (ppm from CFCl:, CD$_2$Cl$_2$) −45.2 (br s, 6F), −51.1 (br s, 6F); $^{13}$C NMR (ppm, CD$_2$Cl$_2$) 121.6 (q, J$_{C-F}$=280.8 Hz), 126.5 (q, J$_{C-F}$=274.6 Hz), 138.8 (s), 139.3 (s), 189.9–190.5 (br); Anal. Calcd.: C, 24.22; H, 0.00; Found: C, 24.23; H, 0.05; EI-Mass Spectrum: m/e =696 for parent ion Ru$_2$C$_{14}$O$_6$F$_{12}^+$ followed by fragments corresponding to loss of 6 CO ligands; m.p. 139°–140° C. This example shows that Ru(hfb)(CO)$_4$ thermally reacts in the gas phase to yield a novel product, Ru$_2$[C$_4$(CF$_3$)$_4$(CO)$_6$, which is an air stable, easily handled material.

EXAMPLE 10

Ten mg of Ru(hfb)(CO)$_4$ and 5 ml of dry toluene were placed in a 50 ml pyrex thick-wall tube and the mixture was stirred and heated to reflux under nitrogen. The reaction solution became yellow within 10 min. After heating and stirring for 3 hrs, the reaction mixture was cooled to room temperature and the solvent was removed under vacuum. A yellow solid was obtained as the only product and it was shown to be identical to the Ru$_2$[C$_4$(CF$_3$)$_{-4}$](CO)$_6$ prepared in Example 9. This example shows the novel product Ru$_2$[C$_4$(CF$_3$)$_4$](CO)$_6$ may be prepared by conventional solution techniques in good yield.

EXAMPLE 11

Os(hfb)(CO)$_4$ was passed through the reactor system described in Example 2 at 300° C. for 10 min under a dynamic vacuum of approximately 1 mtorr. In addition to a thin metallic Os coating on the reactor tube, a white crystalline solid deposited on the cooler portions of the reactor system. Spectroscopic analysis of the solid showed it to be the binuclear complex Os$_2$[C$_4$(CF$_3$)$_4$](CO)$_6$. Spectroscopic data for Os$_2$[C$_4$(CF$_3$)$_4$(CO)$_6$: IR (cm$^{-1}$, CH$_2$Cl$_2$) 2120 (m), 2093 (s), 2057 (m), 2035 (m), 2012 (m); $^{19}$F NMR (ppm from CFCl$_3$, CD$_2$Cl$_2$) −45.7 (br s, 6F), −50.8 (br s, 6F); EI-Mass Spectrum: m/e =788 for parent ion Os$_2$C$_{14}$O$_6$F$_{12}^+$ - 3CO's, 704 for parent ion - 6CO's. The example shows that Os(hfb)-(CO)$_4$ thermally reacts in the gas phase to yield a novel product, OS$_4$[C$_4$(CF$_3$)$_4$](CO)$_4$, which is air stable, easily handled material.

EXAMPLE 12A

Ru$_2$[C$_4$(CF$_3$)$_4$](CO)$_6$ (38.5 mg) in a quartz boat was placed in the center of the reactor tube described in Example 2. The silicon substrates were placed towards the exit of the reactor tube. The precursor was pyrolyzed at 600° C. for 10 min to give highly reflective smooth adherent coatings of metallic Ru on the substrates. AES, as described in Example 5, gave oxygen and fluorine contents in the films of 1% and 0.9%, respectively. The carbon content, as determined by the I$_{273}$/I$_{231}$ intensity ratio, is below the detection limit. This example shows the novel Ru$_2$[C$_4$(CF$_3$)$_{-4}$](CO)$_6$ complex is an effective CVD precursor for ruthenium containing films, that standard CVD equipment may be used, that the films obtained are of high quality, and that carrier gases and high temperatures are not required.

EXAMPLE 12B

Using the reactor system described in Example 2, ruthenium thin films were deposited from Ru$_2$[C$_4$(CF$_3$)$_4$](CO)$_6$ on Si<100> substrates. The deposition was performed without a carrier gas under a dynamic vacuum of 1 to 10 mtorr at 500° C. for 30 min. The precursor and inlet system are warmed to about 60°–70° C. with electric heating tape to assist in precursor volatilization. A highly reflective, smooth, adherent coating of metallic Ru formed on the substrates. The film contains no oxygen, fluorine, or carbon by AES. Stylus profilometry showed the deposition rate to be 20 Å/min. The resistivity of the film is 440 $\mu\Omega$/cm as measured by a standard four-point probe method. This example shows that Ru$_2$[C$_4$(CF$_3$)$_4$](CO)$_6$ is an effective CVD precursor for high quality ruthenium containing films, that standard precursor inlet systems and standard CVD equipment may be used, and that carrier gases and high temperatures are not required.

EXAMPLE 13

A 100 watt mercury lamp fitted with a UV transmitting light guide (Ultracure 100SS, Efos, Inc., Mississauga, Ontario, Canada) was incorporated into the reactor system described in Example 2, so that the light guide illuminated the quartz reactor tube inside the furnace entrance. The furnace is heated to 150° C. and evacuated to approximately 1 mtorr for 30 minutes. The reactor was isolated from the vacuum pump and backfilled with a partial pressure of $Ru_2[C_4(CF_3)_4](CO)_6$. The reactor tube was held at 150° C. and irradiated with the unfiltered output of the lamp for 10 min under a static vacuum. A thin metallic Ru coating was observed on the reactor tube walls in the area illuminated by the lamp. This example shows that the CVD of ruthenium films from the novel $Ru_2[C_4(CF_3)_4](CO)_6$ precursor can be photolytically decomposed and that the depositions can be performed under static vacuum.

EXAMPLE 14

The CVD reactor of Example 2 was fitted with a U-tube mercury manometer directly downstream of the reactor furnace and upstream of the vacuum traps. The system was loaded with Si wafers as in Example 2, evacuated to 10 mtorr, and the reactor was heated to 500° C. for 30 min. Air was passed over the Ru(hfb)-$(CO)_4$ precursor at 25° C. and through the reactor at a 128 cc/min flow rate for 10 min which provided a pressure of 35 torr in the reactor. The air flow was stopped, the reactor cooled, and the Si wafers removed. The wafers contain a dark metallic adherent film of ruthenium oxide which show a uniform concentration of oxygen throughout the depth of the film by AES. The fluorine concentration is below the AES detection limit. This example shows that the depositions may be carried out with a carrier gas, the carrier gas may be a reactive gas, the reactive gas may be air, and that ruthenium oxide films may be formed.

EXAMPLE 15

The CVD reactor of Example 2 was fitted with a U-tube mercury manometer directly downstream of the reactor furnace and upstream of the vacuum traps. The system was loaded with Si wafers as in Example 2, evacuated to 10 mtorr, and the reactor heated to 500° C. for 30 min. Oxygen was passed over the Ru(hfb)$(CO)_4$ precursor at 25° C. and through the reactor at a 128 cc/min flow rate for 15 min which provides a pressure of 115 torr in the reactor. The oxygen flow was stopped, the reactor cooled, and the Si wafers removed. The wafers contain a dark metallic adherent film of ruthenium oxide which shows a uniform concentration of oxygen throughout the depth of the film by AES. Trace amounts of fluorine are also detected by AES. This example shows that the depositions may be carried out with a carrier gas, the carrier gas may be a reactive gas, the reactive gas may be oxygen, and ruthenium oxide films may be formed.

EXAMPLE 16

The CVD reactor of Example 2 was fitted with a U-tube mercury manometer directly downstream of the reactor furnace and upstream of the vacuum traps. The system was loaded with Si wafers as in Example 2, evacuated to 10 mtorr, and the reactor was heated to 550° C. for 30 min. Hydrogen was passed over the Os(hfb)$(CO)_4$ precursor at 25° C. and through the reactor at a 243 cc/min flow rate for 3.5 min which provided a pressure of 34 torr in the reactor. The hydrogen flow was stopped, the reactor cooled, and the Si wafers removed. The wafers contain a metallic adherent film which contains 86% Os, 10% C, and 4% 0 by AES. The film is polycrystalline by XRD. This example shows that the depositions may be carried out with hydrogen, and the carbon levels in the group VIII metal films may be lowered by using a reducing carrier gas.

EXAMPLE 17

Using the reactor system described in Example 2, iron thin films were deposited on Si<100> wafers from $(CO)_4Fe[N(CH_3)_3]$. The precursor was prepared as disclosed by J. Elzinga et al., *J. Org. Chem.*, 45, 3957 (1980). The deposition was performed without a carrier gas under a dynamic vacuum of 1 to 10 mtorr at 300° C. for 20 min. A highly reflective, smooth, adherent coating of metallic Fe was formed on the substrate. The film was shown to contain 85.3% Fe, 8.4% 0, and 6.3% C by AES; no nitrogen was detected. Another film was deposited from $(CO)_4Fe[N(CH_3)_3]$ under identical conditions except that the deposition temperature was 150° C. and the deposition time was 40 min. A metallic Fe film was formed on the substrate and the film shown to contain 78.7% Fe, 15.8% 0, 4.8% C, and 0.7% N by AES. This example shows that $(CO)_4Fe[N(CH_3)_3]$ is an effective CVD precursor for iron containing films, that standard CVD equipment may be used, that carrier gases and high temperatures are not required, and that film composition may be controlled by deposition temperature.

EXAMPLE 18

Using the reactor system described in Example 2, iron thin films were deposited on Si<100> wafers from $(CO)_4Fe[P(OCH_3)_3]$. This precursor was prepared as disclosed by S.B. Butts et al., *J. Organomet. Chem.* 169, 191 (1979). The deposition was performed without a carrier gas under a dynamic vacuum of 1 to 10 mtorr at 500° C. for 30 min. The precursor and inlet system were warmed to about 65° C. with electric heating tape to assist in precursor volatilization. A highly reflective, smooth, adherent coating of metallic Fe formed on the substrates. The film contains 56.1% Fe, 13.6% 0, 6.9% C, and 23.4% P by AES. This example shows that $(CO)_4Fe[P(OCH_3)_3]$ is an effective CVD precursor for iron containing films, that standard CVD equipment may be used, that carrier gases and high temperatures are not required, and that film composition may be controlled by controlling the chemical structure of the precursor.

EXAMPLE 19

Using the reactor system described in Example 2, iron thin films were deposited on Si<100> substrates from $Fe_2(C_4H_4)(CO)_6$ (prepared from $Fe_3(CO)_{12}$ and thiophene according to G. Dettlaf et al., *J. Organomet. Chem.*, 108, 213 (1976)). The deposition was performed without a carrier gas under a dynamic vacuum of 1 to 10 mtorr at 500° C. for 30 min. The precursor and inlet system were warmed to about 65° C. with electric heating tape to assist in precursor volatilization. A highly reflective, smooth, adherent coating of metallic Fe formed on the substrates. The film contains 62.1% Fe, 3.4% 0, and 34.0% C, by AES. A trace amount of sulfur (0.5%) was also detected which may result from residual thiophene contaminant in the precursor. This example shows that $Fe_2(C_4H_4)(CO)_6$ is an effective CVD precursor for iron containing films, that standard CVD equipment may be used, and that carrier gases and high temperatures are not required.

All publications and patents are herein incorporated by reference to the same extent as if each individual publication or patent was specifically and individually indicated to be incorporated by reference.

It will be apparent to one of ordinary skill in the art that many changes and modifications can be made in the invention without departing from the spirit or scope of the appended claims.

What is claimed is:

1. A method for applying a metal film on the surface of a substrate comprising employing the techniques of chemical vapor deposition to decompose a vapor comprising a compound of the formula:

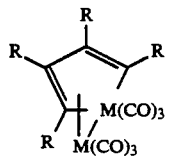

wherein
(a) each M is Fe, Ru or Os; and
(b) each R is H, OH, halo, $(C_1-C_{10})$alkyl, $(C_1-C_{10})$perfluoroalkyl, $(C_6-C_{10})$aryl or two R taken together are benzo;
so as to deposit a film comprising Fe, Ru, Os or mixtures thereof on said surface.

2. The method of claim 1 wherein both M are Fe, Ru or Os.

3. The method of claim 2 wherein both M are Ru or Os.

4. The method of claims 2 or 3 wherein R is H, OH, halo, $(C_1-C_6)$alkyl, $(C_1-C_6)$perfluoroalkyl and phenyl.

5. The method of claim 4 wherein R is H, trifluoromethyl, phenyl or methyl.

6. The method of claim 1 wherein the deposition is carried out at about 150°–700° C.

7. The method of claim 6 wherein the deposition is carried out at about 300°–600° C.

8. The method of claim 1 wherein the deposition is carried out under a vacuum of about 1–100 mtorr.

9. The method of claim 1 wherein the decomposition of the vapor is induced thermally, photolytically or both thermally and photolytically.

10. The method of claim 1 further comprising employing a carrier gas to transport the vapor to the surface of the substrate.

11. The method of claim 1 wherein the film consists essentially of Ru, Os or Fe.

12. The method of claim 11 wherein the film consists essentially of Ru or Os.

13. The method of claim 1 wherein the vapor further comprises an amount of an oxidizing agent effective to deposit a film of ruthenium oxide, osmium oxide or iron oxide on said surface.

14. The method of claim 13 wherein the oxidizing agent is provided by $CO_2$, $N_2O$, tetrahydrofuran, oxygen, air or steam.

15. The method of claim 13 wherein the oxidizing agent is mixed with a carrier gas.

16. The method of claim 1 wherein a coherent conformal film comprising Ru, Os or Fe is deposited on a substrate of irregular topography.

17. The method of claim 1 wherein the film consists essentially of Ru, Os or Fe.

UNITED STATES PATENT AND TRADEMARK OFFICE
CERTIFICATE OF CORRECTION

PATENT NO. : 5,314,727

DATED : May 24, 1994

INVENTOR(S) : McCormick et al.

It is certified that error appears in the above-indentified patent and that said Letters Patent is hereby corrected as shown below:

Col. 1, line 21, Insert --Chemical-- before "Vapor"

Col. 4, line 44, Replace "$C_{19}$" with --$C_{10}$--

Col. 4, line 51, Replace "(C-C<)" with --($C_1$-$C_4$)--

Col. 4, line 66, Replace "$\leq$" with --$\leq$--

Col. 5, line 45, Replace first "R" with --$R^1$--

Col. 6, line 27, Insert --)-- after second "$(R^1)_2$"

Col. 12, line 68, Delete "r"

Col. 13, line 43, Delete "." after m

Col. 17, line 49, Replace "$CFCl$:" with --$CFCl_3$--

Col. 18, line 15, Insert --]-- after "$Os_2[C_4(CF_3)_4$"

Col. 18, line 48, Delete the hard return after "system"

Col. 18, line 54, Replace "A" with --Å--

Col. 19, line 66; Col. 20, line 13; Col. 20, line 19; Col. 20, line 38; and Col. 20, line 60, Replease the zero with --O--

UNITED STATES PATENT AND TRADEMARK OFFICE
CERTIFICATE OF CORRECTION

PATENT NO. : 5,314,727
DATED : May 24, 1994
INVENTOR(S) : McCormick, et al.

It is certified that error appears in the above-indentified patent and that said Letters Patent is hereby corrected as shown below:

Col. 21, line 32, replace "claim 2 of 3" with --claims 1 or 2--.

Signed and Sealed this

First Day of November, 1994

BRUCE LEHMAN

Attest:

Attesting Officer

Commissioner of Patents and Trademarks